United States Patent
Lin et al.

(10) Patent No.: US 7,774,031 B2
(45) Date of Patent: Aug. 10, 2010

(54) PORTABLE ELECTRONIC DEVICE WITH OPERATION MODE DETERMINED IN ACCORDANCE WITH POWER CONSUMPTION AND METHOD THEREOF

(75) Inventors: Chih-Shen Lin, Hsinchu (TW); Te-Yu Kao, Hsinchu (TW); Young-Fei Chien, Hsinchu (TW)

(73) Assignee: Altek Corporation, Hsinchu (TW)

( * ) Notice: Subject to any disclaimer, the term of this patent is extended or adjusted under 35 U.S.C. 154(b) by 778 days.

(21) Appl. No.: 11/367,474

(22) Filed: Mar. 6, 2006

(65) Prior Publication Data

US 2007/0148534 A1 Jun. 28, 2007

(30) Foreign Application Priority Data

Dec. 27, 2005 (TW) .............................. 94146814 A

(51) Int. Cl.
*H04B 1/38* (2006.01)
*H04M 1/00* (2006.01)

(52) U.S. Cl. ................. 455/574; 455/343.1; 455/343.2; 455/127.5

(58) Field of Classification Search ............... 455/73, 455/566, 571, 572, 573, 574, 343.2, 343.5, 455/343.6, 343.1, 127.5
See application file for complete search history.

(56) References Cited

U.S. PATENT DOCUMENTS

2005/0227635 A1* 10/2005 Hawkins et al. ............ 455/90.3
2005/0250531 A1* 11/2005 Takebe et al. ............ 455/550.1

* cited by examiner

*Primary Examiner*—Tuan A Pham
(74) *Attorney, Agent, or Firm*—Rosenberg, Klein & Lee

(57) ABSTRACT

A portable electronic device with an operation mode determined in accordance with power consumption and an operation mode switching method thereof are proposed. The method examines the voltage required by different systems to control every power system independently. By examining the capacity of a battery cell unit and comparing the capacity result with a first reference capacity and a second reference capacity, whether to offer operation power in order to operate a mobile communication module or a digital camera module is determined. Therefore, when a digital camera module, which has high power consumption requirements, is off, the mobile communication module can still operate to effectively use energy provided by the power supply unit.

8 Claims, 4 Drawing Sheets

PORTABLE ELECTRONIC DEVICE WITH OPERATION MODE DETERMINED IN ACCORDANCE WITH POWER CONSUMPTION AND METHOD THEREOF

BACKGROUND OF THE INVENTION

1. Field of the Invention

The present invention relates to a portable electronic device with switchable operation modes and an operation mode switching method thereof and, more particularly, to a portable electronic device with an operation mode determined in accordance with power consumption and an operation mode switching method thereof.

2. Description of Related Art

With the continued progress of science and technology and the development of the communication and consumer electronic industries, electronic devices with many kinds of functions are more and more appreciated. For instance, many of today's mobile phones have a built-in digital still camera (DSC) function, or a mobile phone function is often added into personal digital assistants (PDAs). A single device can thus become multifunctional. In addition to achieving more plentiful activities, more added values can also be generated to increase the market share of a device.

In order to make a single device multifunctional, however, there inevitably are drawbacks in quality. For example, the picture quality of the DSC function of today's mobile phones is inferior to that of more specialized cameras. For improving the picture quality of the DSC function in a mobile phone and increasing the number of pixels of the DSC module, the mobile phone system and the DSC module can be separately used with current techniques so that the DSC module can perform image processing and operations using its own processor. The DSC module then, is no longer limited by the image processing capability of the processor of the mobile phone system. The DSC function in the mobile phone can therefore be enhanced to the level of mainstream DSCs in the market.

However, the problem of power consumption arises. For instance, a mobile phone with a DSC function consumes more power during its operation than a simple mobile phone. FIG. 1 is a diagram showing the reference capacity point of the prior art, wherein the power-off capacity point of the mobile phone system and that of the DSC module are set to the same capacity point T. This will lead to the problem of the mobile phone system shutting off once the DSC module is shut off. Therefore, the mobile phone cannot fully utilize its battery power, and its standby time is short.

SUMMARY OF THE INVENTION

An object of the present invention is to provide a portable electronic device with switchable operation modes and an operation mode switching method thereof, in which the power-off capacity point of a DSC module and that of a mobile communication module are set differently from each other, and the DSC module can only operate at high battery capacities, while the mobile communication module can still operate at low battery capacities.

To achieve the above object, the present invention provides a method for determining the operation mode of a portable electronic device in accordance with power consumption. The method comprises the following steps: firstly, the capacity of a battery cell unit is detected. Whether the capacity of the battery cell unit is higher than a first reference capacity is then determined by comparison. If the answer is yes, the mobile communication module and the DSC module are operated; if the answer is no, only the mobile communication module is operated while the DSC module is shut off. Next whether the capacity of the battery cell unit is higher than a second reference capacity is determined by comparing the two. If the answer is yes, the mobile communication module is operated; if the answer is no, both the mobile communication module and the DSC module are shut off. The energy of the battery cell unit can thus be fully utilized to improve the problem of short standby time encountered in the prior art.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
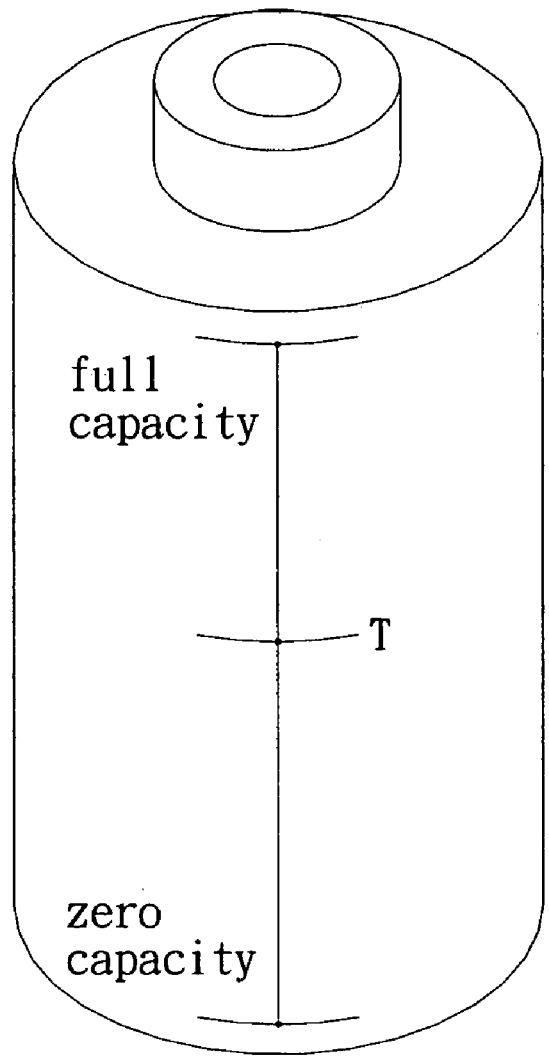
FIG. 1 is a diagram showing the reference capacity point in the prior art.
Figure 2:
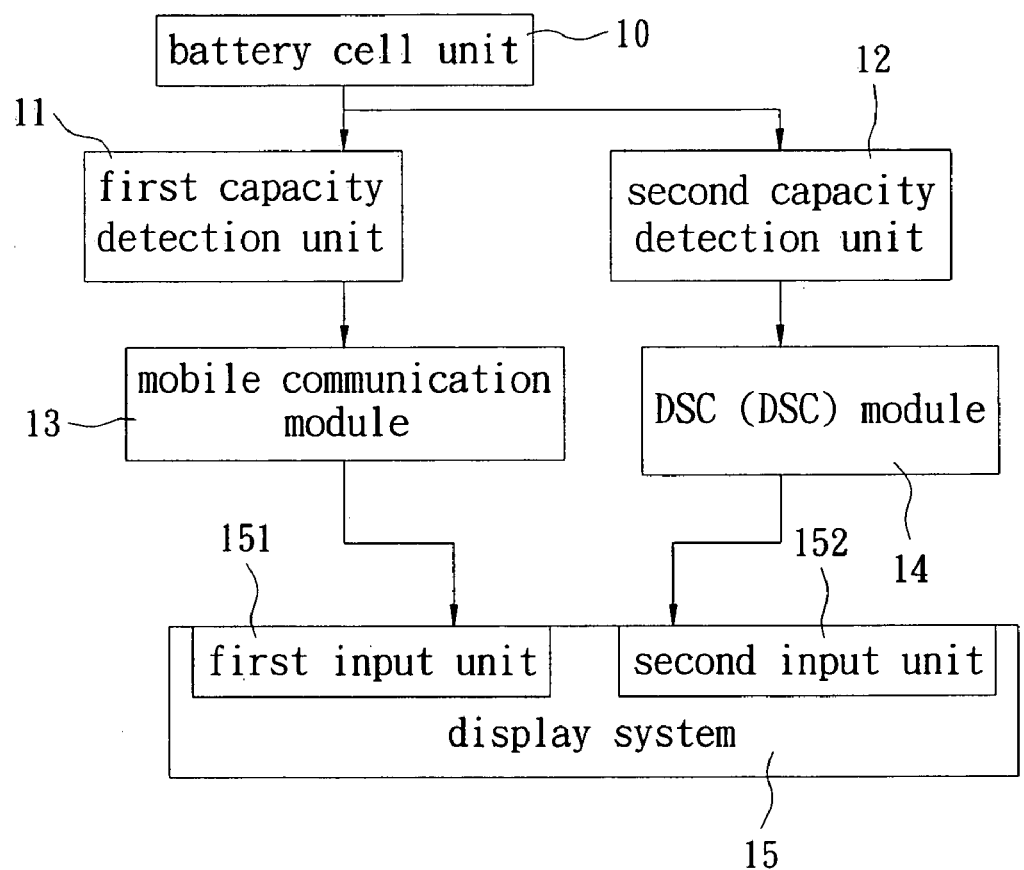
FIG. 2 is a block diagram of a portable electronic device with an operation mode determined in accordance with power consumption according to a preferred embodiment of the present invention.
Figure 3:
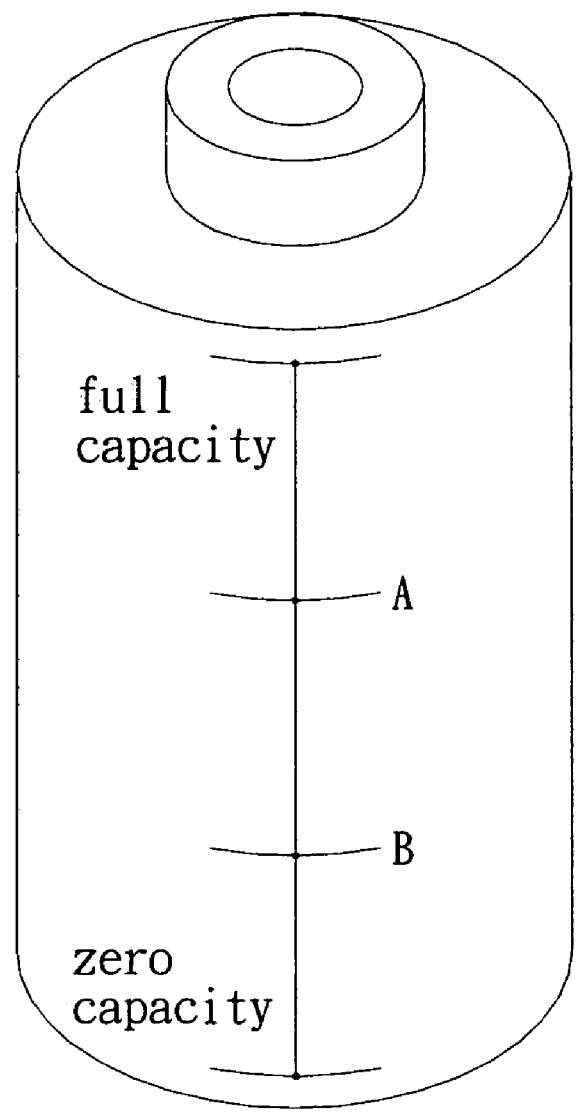
FIG. 3 is a diagram showing the reference capacity points of a portable electronic device with an operation mode determined in accordance with power consumption of the present invention.

FIG. 2 is a block diagram of a portable electronic device with an operation mode determined in accordance with power consumption according to a preferred embodiment of the present invention. The portable electronic device comprises a battery cell unit 10, a first capacity detection unit 11, a second capacity detection unit 12, a DSC module 13, a mobile communication module 14 and a display system 15. Based on different design requirements, the first capacity detection unit 11 and the second capacity detection unit 12 can be a voltage detector IC or an electronic circuit. According to different use requirements, the mobile communication module 14 can be a mobile phone system, a PDA phone, or a PDA system. As shown in FIG. 3, the first reference capacity (as indicated by A) provided by the first capacity detection unit 11 is the minimum threshold capacity for operation of the DSC module 13, and the second reference capacity (as indicated by B) provided by the second capacity detection unit 12 is the minimum threshold capacity for operation of the mobile communication module 14. The second reference capacity is designed to be lower than the first reference capacity.

Moreover, the battery cell unit 10 can be an NiMH battery or an Li-ion battery. The battery cell unit 10 provides power for the operations of the DSC module 13 and the mobile communication module 14. The DSC module 13 is electrically connected to the battery cell unit 10 via the first capacity detection unit 11, which is used for detecting the present capacity of the battery cell unit 10 and controlling the power switch of the DSC module 13. When the present capacity of the battery cell unit 10 is lower than the first reference capacity provided by the first capacity detection unit 11, the DSC module 13 shuts off. Similarly, the mobile communication module 14 is electrically connected to the battery cell unit 10 via the second capacity detection unit 12, which is used for detecting the present capacity of the battery cell unit 10 and controlling the power switch of the mobile communication module 14. When the present capacity of the battery cell unit 10 is lower than the second reference capacity provided by the second capacity detection unit 12, the mobile communication module 14 is also shut off.

The DSC module 13 and the mobile communication module 14 together use the display system 15 for displaying images. The display system 15 is a dual channel display system having a first input unit 151 and a second input unit 152. The first input unit 151 is a video input unit for receiving video. The second input unit 152 is a system information input unit for receiving system information. Because the DSC module 13 transmits image signals by means of video streaming, it is electrically connected to the display system 15 via the first input unit 151 for image input. Because the mobile communication module 14 transmits signals by means of system interface, it is electrically connected to the display system 15 via the second input unit 152 for image input.

Figure 4:
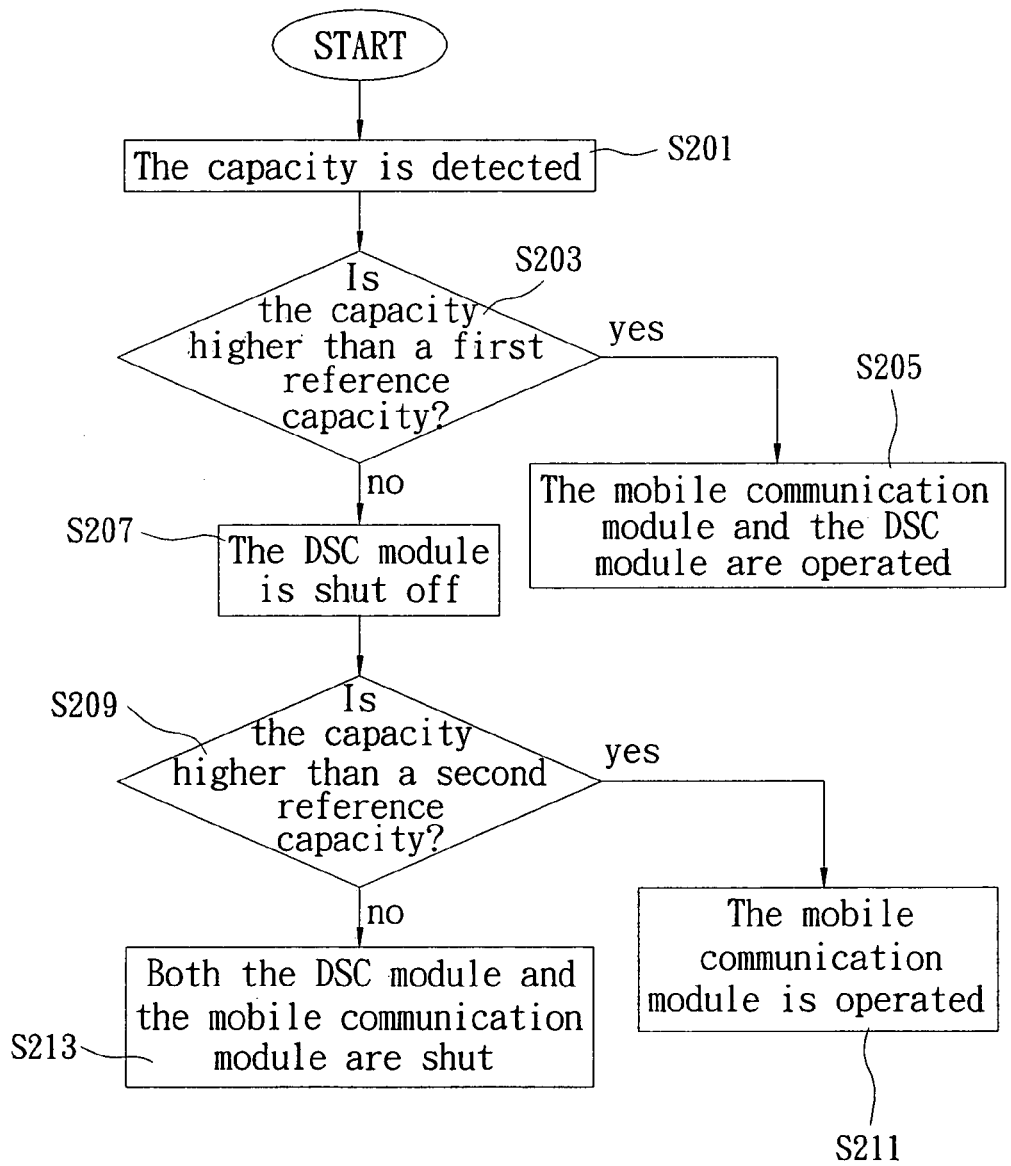
FIG. 4 is a flowchart of a method for determining operation mode of a portable electronic device in accordance with power consumption according to a preferred embodiment of the present invention.

FIG. 4 is a flowchart of a method for determining an operation mode of a portable electronic device in accordance with power consumption according to a preferred embodiment of the present invention. First, the present capacity of the battery unit cell 10 is detected (Step S201). According to different requirements, the battery cell unit 10 can be an NiMH battery or an Li-ion battery. Next, whether the capacity of the battery cell unit 10 is higher than the first reference capacity provided by the first capacity detection unit 11 is determined (Step S203). If the answer is yes, the battery cell unit 10 provides a sufficiently high voltage to operate the mobile communication module 14 and the DSC module 13 (Step S205); if the answer is no, the DSC module 13 is shut off (Step S207) and cannot be activated from the off state. The second reference capacity is designed to be lower than the first reference capacity. Under the situation that the present capacity of the battery cell unit 10 is lower than the first reference capacity, whether the present capacity of the battery cell unit 10 is higher than the second reference capacity provided by the second capacity detection unit 12 is determined (Step S209). If the answer is yes, the battery cell unit 10 still provides a sufficiently high voltage to operate the mobile communication module 14; if the answer is no, both the mobile communication module 14 and the DSC module 13 are shut off and cannot be activated from the off state.

The first reference capacity is the minimum threshold capacity for operation of the DSC module 13, and the second reference capacity is the minimum threshold capacity for operation of the mobile communication module 14. Based on different design requirements, the first capacity detection unit 11 and the second capacity detection unit 12 can be a voltage detector IC or an electronic circuit. According to different use requirements, the mobile communication module 14 can be a mobile phone system, a PDA phone, or a PDA system.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A portable electronic device with a plurality of operation modes determined in accordance with power consumption, comprising:

a digital still camera (DSC) module;

a mobile communication module;

a battery cell unit for providing a voltage for operation of said DSC module and said mobile communication module;

a first voltage detection unit coupled between said battery cell unit and said DSC module, said first voltage detection unit detecting a voltage provided by said battery cell unit and selectively shutting off said DSC module, independent of said mobile communication module operation mode, when said voltage provided by said battery cell unit is lower than a first reference voltage, wherein said first reference voltage is a predetermined minimum threshold voltage sufficient for operation of said DSC module; and a second voltage detection unit coupled between said battery cell unit and said mobile communication module, said second voltage detection unit detecting the voltage provided by said battery cell unit and selectively shutting off said mobile communication module, independent of said DSC module operation mode, when said voltage provided by said battery cell unit is lower than a second reference voltage, wherein said second reference voltage is a predetermined minimum threshold voltage sufficient for operation of said mobile communication module, and wherein said second reference voltage is lower than said first reference voltage;

wherein, when said voltage provided by said battery cell unit is higher than said first reference voltage, both of said DSC module and said mobile communication module are maintained operative, wherein, when said voltage provided by said battery cell unit is between said first reference voltage and said second reference voltage, only the mobile communication module is maintained operative, and wherein, when said voltage provided by said battery cell unit is lower than said second reference voltage, both of said DSC module and said mobile communication module are deactivated.

2. The portable electronic device as claimed in claim 1, wherein said mobile communication module is a mobile phone system, a PDA phone, or a PDA system.

3. The portable electronic device as claimed in claim 1, wherein said battery cell unit is an NiMH battery or an Li-ion battery.

4. The portable electronic device as claimed in claim 1, wherein said first voltage detection unit is a voltage detector IC or an electronic circuit.

5. The portable electronic device as claimed in claim 1, wherein said second voltage detection unit is a voltage detector IC or an electronic circuit.

6. The portable electronic device as claimed in claim 1, further comprising a display system, wherein said display system is used to display output images of said DSC module and said mobile communication module.

7. The portable electronic device as claimed in claim 6, wherein said display system has a first input unit and a second input unit, said DSC module is electrically connected to said display system via said first input unit, and said mobile communication module is electrically connected to said display system via said second input unit.

8. The portable electronic device as claimed in claim 7, wherein said first input unit is a video input unit for receiving video, and said second input unit is a system information input unit for receiving system information.

* * * * *